(12) United States Patent
Sinha et al.

(10) Patent No.: US 8,760,202 B1
(45) Date of Patent: Jun. 24, 2014

(54) SYSTEM FOR GENERATING CLOCK SIGNAL

(71) Applicants: Samaksh Sinha, Singapore (SG); Niti Gupta, Noida (IN); Sunny Gupta, Noida (IN)

(72) Inventors: Samaksh Sinha, Singapore (SG); Niti Gupta, Noida (IN); Sunny Gupta, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/895,344

(22) Filed: May 15, 2013

(51) Int. Cl.
*H03L 7/06* (2006.01)

(52) U.S. Cl.
USPC .............................. 327/157; 327/148

(58) Field of Classification Search
USPC .................. 327/147–149, 156–158
See application file for complete search history.

(56) References Cited

U.S. PATENT DOCUMENTS

| | | | |
|---|---|---|---|
| 4,937,536 A | 6/1990 | Reinhardt | |
| 7,439,784 B2 | 10/2008 | Lin | |
| 7,714,625 B2 | 5/2010 | Chatterjee | |
| 7,834,707 B2 | 11/2010 | Chien | |
| 7,893,737 B2 | 2/2011 | Haerle | |
| 8,085,071 B2 | 12/2011 | Higashi | |
| 8,125,253 B2 | 2/2012 | Goldman | |
| 8,368,442 B1 | 2/2013 | Chen | |
| 8,432,201 B1 | 4/2013 | Sinha | |
| 8,633,749 B2* | 1/2014 | Bass et al. | 327/158 |
| 2010/0073051 A1* | 3/2010 | Rao et al. | 327/157 |
| 2010/0321119 A1* | 12/2010 | Wu et al. | 331/25 |
| 2011/0080199 A1 | 4/2011 | Yen | |
| 2011/0102034 A1 | 5/2011 | Haerle | |
| 2011/0221487 A1* | 9/2011 | Lesso | 327/147 |
| 2012/0098581 A1 | 4/2012 | Haerle | |
| 2013/0076450 A1* | 3/2013 | Rao et al. | 331/34 |

OTHER PUBLICATIONS

Sun, Yuanfeng; Qiao, Jian; Yu, Xueyi; Rhee, Woogeun; Park, Byeong-Ha; and Wang, Zhihua, "A Continuously Tunable Hybrid LC-VCO PLL With Mixed-Mode Dual-Path Control and Bi-level Modulated Coarse Tuning," IEEE Transactions on Circuits and Systems-I: Regular Papers, vol. 58, No. 9, Sep. 2011, pp. 2149-2158.

* cited by examiner

*Primary Examiner* — Adam Houston
(74) *Attorney, Agent, or Firm* — Charles Bergere

(57) ABSTRACT

A system for generating a clock signal includes a phase-locked loop (PLL) and a voltage storage circuit. The PLL includes a voltage-controlled oscillator (VCO) that generates a clock signal based on a control voltage. The voltage storage circuit includes a unity-gain amplifier (UGA) and first, second and third switches. The first switch connects an input terminal of the UGA and an input of the VCO to sample the control voltage before the PLL transitions from RUN mode to STOP mode. The second switch connects the input and output terminals of the UGA to store the sampled control voltage when the PLL is in STOP mode. The third switch connects the output terminal of the UGA to the input terminal of a low pass filter (LPF) to provide the stored control voltage to the LPF when the PLL transitions from the STOP mode to the RUN mode.

11 Claims, 3 Drawing Sheets

US 8,760,202 B1

SYSTEM FOR GENERATING CLOCK SIGNAL

BACKGROUND OF THE INVENTION

The present invention relates generally to phase-locked loop (PLL) circuits and, more particularly, to reducing lock re-acquisition time in a phase-locked loop (PLL) circuit.

Integrated circuits such as microprocessors, microcontroller units (MCUs), system-on-chips (SOCs), and application specific integrated circuits (ASICs) are widely used in portable devices including personal digital assistants (PDAs), tablet devices, and wireless communications devices. These devices use phase-locked loops (PLLs) that generate a clock signal based on an input reference signal. The clock signal has a phase and frequency that is directly proportional with the corresponding phase and frequency of the input reference signal. In integrated circuits (ICs), the clock signal generated by the PLL is used as a clock signal for synchronous operation of the internal circuitry.

FIG. 1 illustrates a schematic block diagram of a conventional PLL 100. The PLL 100 includes a voltage-controlled oscillator (VCO) 102, a frequency divider 104, a phase-frequency detector (PFD) 106, a charge pump 108 and a low pass filter (LPF) 110. The VCO 102 generates a clock signal having a frequency $f_{out}$ based on a control voltage $V_{ctrl}$. The PFD 106 is connected to the VCO 102 by way of the frequency divider 104 and compares the phase of the clock signal with that of an input reference signal to generate an error signal based on a detected phase difference. The frequency divider 104 provides a fraction of the clock signal to the PFD 106. The charge pump 108 is connected to the PFD 106 and the VCO 102. The charge pump 108 receives the error signal and generates a charge pump current. The LPF 110, which is connected between the charge pump 108 and the VCO 102, receives the charge pump current and generates the control voltage $V_{ctrlr}$ which is then provided to the VCO 102, which in turn generates the clock signal having the frequency $f_{out}$.

The clock signal generated by the PLL 100 is provided as a clock signal to an IC (not shown). ICs often are required to operate on a low supply voltage in order to consume as little battery power as possible, and hence are frequently switched from a RUN mode to a STOP mode during periods of inactivity. Wake-up circuitry is provided in the IC to switch the IC from the STOP mode to the RUN mode. The PLL 100 is switched OFF when the IC enters the STOP mode and is switched ON when the IC wakes up from the STOP mode and enters the RUN mode. After switching ON, the PLL 100 takes a finite amount of time to reach the lock frequency $f_{out}$ (referred to as PLL lock re-acquisition time). The PLL lock re-acquisition time adds to the wake-up time (time taken by the IC to transition from the STOP mode to the RUN mode) of the IC. A long wake-up time is undesirable, while a short wake-up time is especially useful when the IC performs time-critical applications.

Therefore, it would be advantageous to have a PLL with a fast PLL lock re-acquisition time.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
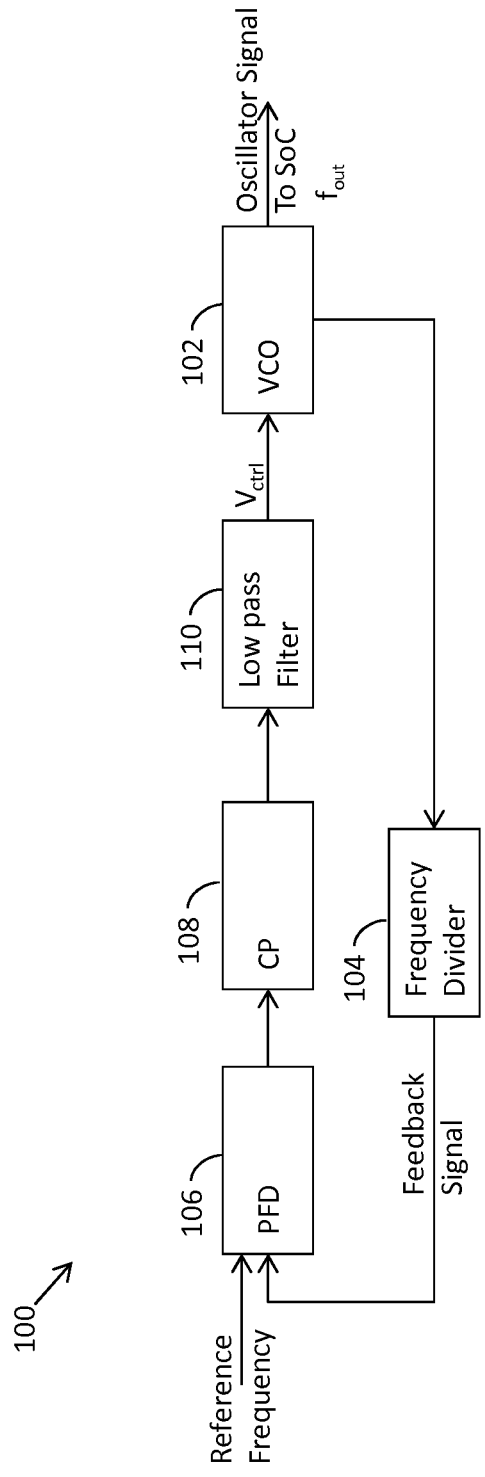
FIG. 1 is a schematic block diagram of a conventional phase-locked loop (PLL)

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for generating a clock signal is provided. The system includes a phase-locked loop (PLL) that includes a phase-frequency detector (PFD) for generating an error signal based on an input reference signal and a feedback signal, a charge pump connected to the PFD for generating a charge pump current based on the error signal, a low pass filter (LPF) having an input terminal connected to the charge pump for generating a control voltage based on the charge pump current, a voltage-controlled oscillator (VCO) connected to an output terminal of the LPF for generating the clock signal having a frequency proportional to the control voltage, and a frequency divider, connected between the VCO and the PFD, for generating the feedback signal by adjusting a frequency of the clock signal. The system further includes a voltage storage circuit that includes a unity-gain amplifier (UGA) having an input and an output terminal and first, second and third switches. The first switch is connected between the input terminal of the UGA and the output terminal of the LPF, for disconnecting the input terminal of the UGA from the output terminal of the LPF when the PLL is in a STOP mode, and connecting the input terminal of the UGA and the output terminal of the LPF, for sampling the control voltage for a first predefined period when the PLL is in a RUN mode. The second switch is connected between the output and input terminals of the UGA, for disconnecting the output and input terminals of the UGA when the PLL is in the RUN mode, and connecting the output and input terminals of the UGA at the end of the first predefined period, for storing the sampled control voltage when the PLL is in the STOP mode. The third switch is connected between the output terminal of the UGA and an input terminal of the LPF, for disconnecting the output terminal of the UGA from the input terminal of the LPF when the PLL is in the STOP mode, and connecting the output terminal of the UGA and the input terminal of the LPF for providing the stored control voltage to the input terminal of the LPF for a second predefined period when the PLL transitions from the STOP mode to the RUN mode.

In another embodiment of the present invention, a system for generating a clock signal is provided. The system includes a phase-locked loop (PLL), that includes a phase-frequency detector (PFD) for generating an error signal based on an input reference signal and a feedback signal, a charge pump connected to the PFD for generating a charge pump current based on the error signal, a low pass filter (LPF) having an input terminal connected to the charge pump for generating a control voltage based on the charge pump current, a voltage-controlled oscillator (VCO) connected to an output terminal of the LPF for generating the clock signal having a frequency proportional to the control voltage, and a frequency divider connected between the VCO and the PFD for generating the feedback signal by adjusting a frequency of the clock signal. The system further includes a voltage storage circuit, that includes a unity-gain amplifier (UGA) having an input terminal and an output terminal, first, second and third switches, and a voltage multiplier. The first switch is connected between the input terminal of the UGA and the output terminal of the LPF, for disconnecting the input terminal of the UGA from the output terminal of the LPF when the PLL is in a STOP mode, and connecting the input terminal of the UGA and the output terminal of the LPF, for sampling the control voltage for a first predefined period when the PLL is in a RUN mode. The second switch is connected between the output and input terminals of the UGA, for disconnecting the output and input terminals of the UGA when the PLL is in the RUN mode, and connecting the output and input terminals of the UGA at the end of the first predefined period, for storing the sampled control voltage when the PLL is in the STOP mode. The voltage multiplier is connected to the output terminal of the UGA for adjusting the stored control voltage based on a predetermined frequency of the clock signal. The third switch is connected between the output terminal of the voltage multiplier and an input terminal of the LPF, for disconnecting the output terminal of the voltage multiplier from the input terminal of the LPF when the PLL is in the STOP mode, and connecting the output terminal of the voltage multiplier and the input terminal of the LPF for providing the stored control voltage to the input terminal of the LPF for a second predefined period when the PLL transitions from the STOP mode to the RUN mode.

Various embodiments of the present invention provide a system for generating a clock signal. The system includes a phase-locked loop (PLL) and a voltage storage circuit. The PLL includes a voltage-controlled oscillator (VCO) that generates a clock signal having a frequency proportional to a control voltage. The voltage storage circuit includes a unity-gain amplifier (UGA) and first, second and third switches. The first switch connects an input terminal of the UGA and an input of the VCO to sample the control voltage, before the PLL transitions from a RUN mode to a STOP mode. The second switch connects the input and output terminals of the UGA to store the sampled control voltage, when the PLL is in the STOP mode. The third switch connects the output terminal of the UGA to the input terminal of a low pass filter of the PLL, to provide the stored control voltage to the LPF, when the PLL transitions from the STOP mode to the RUN mode. In the RUN mode, the VCO generates the clock signal based on the stored control voltage, which reduces the frequency lock re-acquisition time. The system of the present invention can be advantageously used in an integrated circuit as it enables the integrated circuit to quickly transition from the STOP mode to the RUN mode and improves the wake-up time and performance of the integrated circuit.

Figure 2:
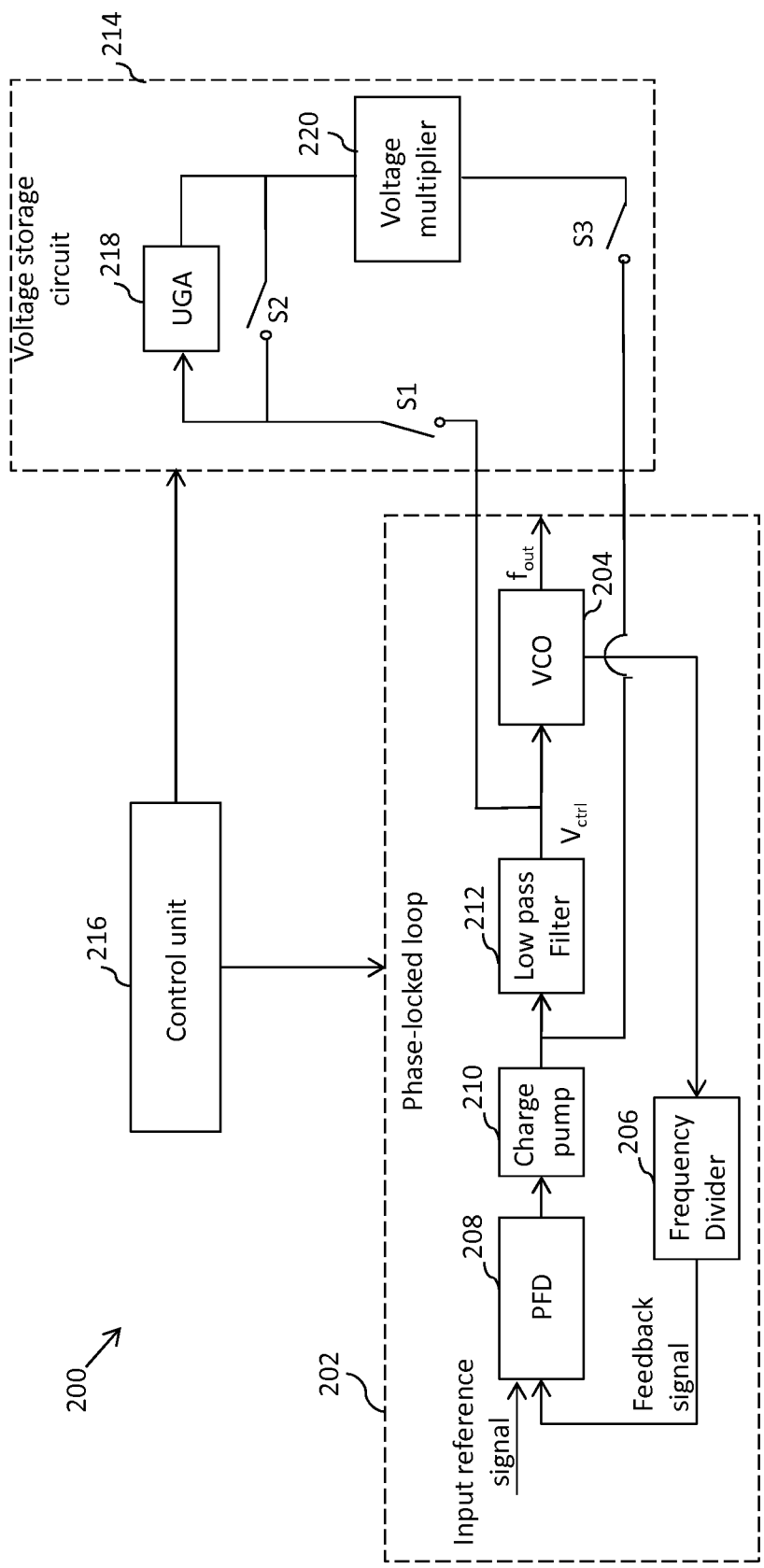
FIG. 2 is a schematic block diagram of a system for generating a clock signal in accordance with an embodiment of the present invention.

Referring now to FIG. 2, a schematic block diagram of a system 200 for generating a clock signal in accordance with an embodiment of the present invention is shown. The system 200 includes a phase-locked loop (PLL) 202 that includes a voltage-controlled oscillator (VCO) 204, a frequency divider 206, a phase-frequency detector (PFD) 208, a charge pump 210, and a low pass filter (LPF) 212. The system 200 further includes a voltage storage circuit 214 and a control unit 216. The control unit 216 is connected to the PLL 202 and the voltage storage circuit 214.

The VCO 204 generates a clock signal having a frequency $f_{out}$ based on a control voltage $V_{ctrl}$. The PFD 208 is connected to the VCO 204 by way of the frequency divider 206 and compares the phase of the clock signal with that of an input reference signal to generate an error signal based on the detected phase difference. The frequency divider 206 provides a fraction of the clock signal to the PFD 208. The charge pump 210 is connected to the PFD 208 and the VCO 204. The charge pump 210 receives the error signal and generates a charge pump current. The LPF 212, which is connected between the charge pump 210 and the VCO 204, receives the charge pump current and generates the control voltage $V_{ctrl}$, which is then provided to the VCO 204, which in turn generates the clock signal having frequency $f_{out}$.

In various embodiments of the present invention, the PLL 202 is used with an integrated circuit (not shown) and provides the clock signal to the integrated circuit. The integrated circuit may be a microprocessor, a microcontroller, a system-on-chip (SoC), an application specific integrated circuit (ASIC), and the like, and is capable of operating in RUN and STOP modes. When the integrated circuit transitions from the RUN mode to the STOP mode, the PLL 202 is switched OFF (or enters the STOP mode) and stops providing the clock signal to the integrated circuit. The PLL 202 is switched ON (or enters the RUN mode) to resume supply of the clock signal when the integrated circuit wakes up from the STOP mode and enters the RUN mode. After switching ON, the PLL 202 takes a finite amount of time to reach the locking frequency $f_{out}$ (referred to as PLL lock re-acquisition time), that is, the time for the clock signal to stabilize at the locking frequency.

The voltage storage circuit 214 and the control unit 216 are provided to reduce the lock re-acquisition time of the PLL 202. The voltage storage circuit 214 includes a unity-gain amplifier (UGA) 218, first, second and third switches S1, S2, and S3 respectively, and a voltage multiplier 220. An example of the UGA 218 includes an operational amplifier in a unity gain configuration.

In various embodiment of the present invention, the first, second and third switches S1, S2, and S3 are complementary metal-oxide semiconductor (CMOS) transmission gates. The first switch S1 is connected between an input terminal of the UGA 218 and the output terminal of the LPF 212. The second switch S2 is connected between output and input terminals of the UGA 218. The voltage multiplier 220 is connected to the output terminal of the UGA 218. The third switch S3 is connected between an output terminal of the voltage multiplier 220 and an input terminal of the LPF 212.

The control unit 216 generates a plurality of control signals for controlling the PLL 202 and the voltage storage circuit 214. For example, the control unit 216 generates a PLL_EN signal that is a logic low signal to switch off the PLL 202 when the integrated circuit is in the STOP mode and a logic high signal to switch on the PLL 202 when the integrated circuit is in the RUN mode. The control unit 216 further generates a PLL lock signal that is a logic low signal when the PLL 202 is not in a locked state and a logic high signal when the PLL 202 is in a locked state. The control unit 216 further generates first, second and third control signals, which are logic high signals for enabling the first, second and third switches S1, S2 and S3 respectively, and are logic low signals for disabling the first, second and third switches S1, S2 and S3 respectively.

Figure 3:
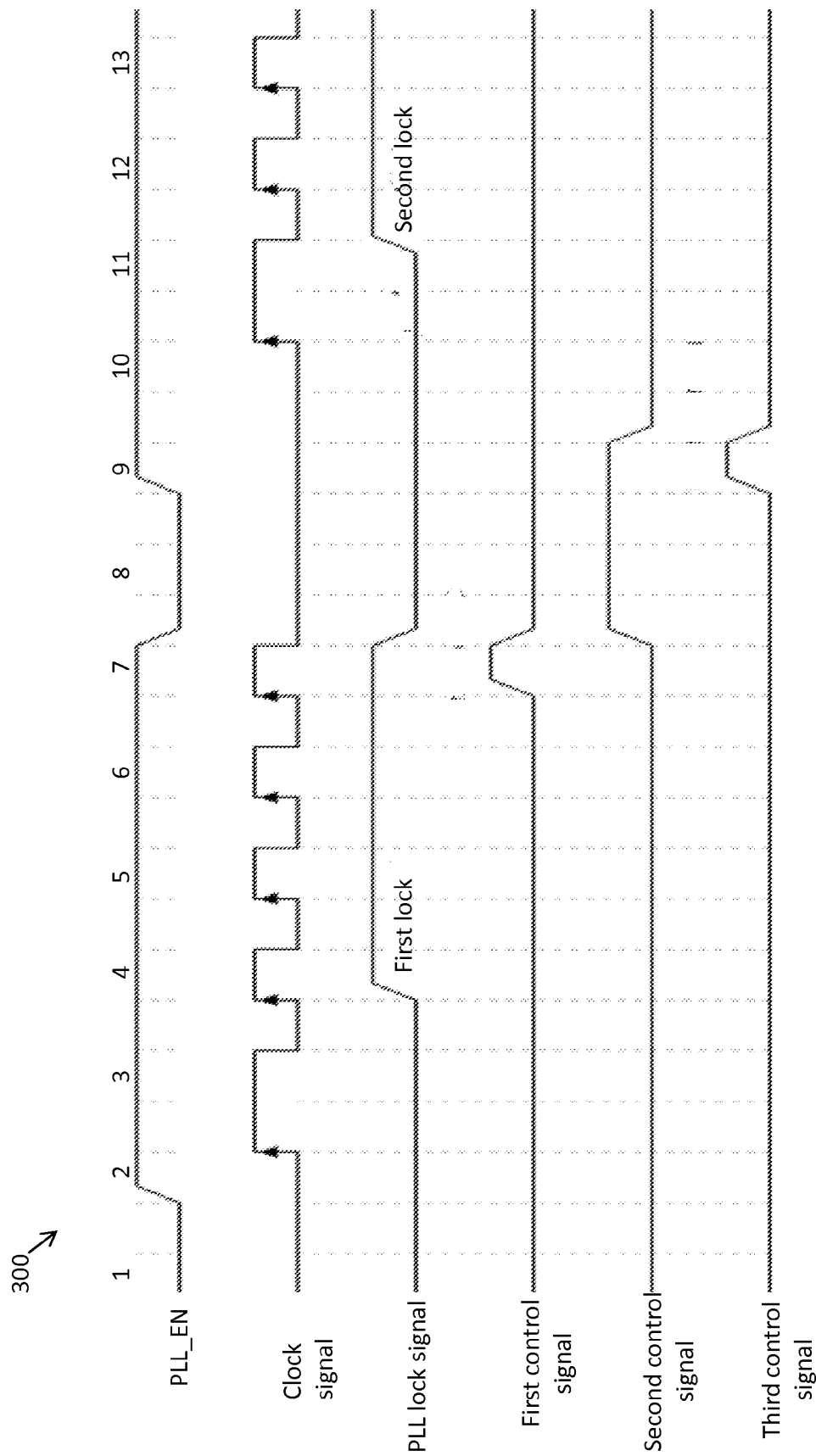
FIG. 3 is a timing diagram of the clock and various control signals of the system of FIG. 2.

FIG. 3 shows a timing diagram 300 of the PLL_EN signal, the clock signal, the PLL lock signal, and the first, second and third control signals. The functioning of the system 200 has been explained with reference to the timing diagram 300. The timing diagram 300 illustrates thirteen time slots (T1-T13). At T1, the PLL_EN signal is in a logic low state and therefore, the PLL 202 is switched off (or enters the STOP mode) and does not generate a clock signal. At T2, the PLL_EN signal transitions from a logic low to logic high state and switches on the PLL 202. After the PLL 202 is switched on (i.e., enters the RUN mode), the VCO 204 generates the clock signal. At the onset of T4, the clock signal achieves a locking frequency $f_{out}$ based on a control voltage $V_{ctrl}$ at input of the VCO 204, and the PLL lock signal transitions from a logic low to logic high state, indicating that the PLL 202 has stabilized in a first lock state. The PLL 202 stabilizes in the first lock state approximately two time slots after entering the RUN mode, and maintains the control voltage $V_{ctrl}$ and the clock signal (with locking frequency $f_{out}$) at the input and output of the VCO 204 respectively.

During T1-T6, the voltage storage circuit 214 is disabled and the first, second and third control signals are in logic low state. At T7, the PLL_EN signal transitions from logic high to logic low state and switches off the PLL 202, and the PLL lock signal transitions from logic high to logic low state which indicates that the PLL 202 has stopped generating the clock signal and has exited from the first lock state. However, at the onset of T7 and before the transition of the PLL_EN signal from logic high to logic low state, the first control signal transitions from logic low to logic high state for a first predefined period and enables the first switch S1. The first switch S1 therefore connects the input terminal of the UGA 218 and the output terminal of the LPF 212 and enables the UGA 218. The UGA 218 samples the control voltage $V_{ctrl}$ for the first predefined period. At the end of the first predefined period, the first control signal transitions from logic high to logic low state and disables the first switch S1, thereby causing the UGA 218 to stop sampling the control voltage $V_{ctrl}$. Further, at the end of the first predefined period, the PLL_EN signal transitions from logic high to logic low state and switches off the PLL 202. Thus, the UGA 218 samples the control voltage $V_{ctrl}$ before the PLL 202 is switched off (or enters in to the STOP mode).

When the PLL_EN signal transitions from logic high to logic low state, the second control signal transitions from logic low to logic high state to enable the second switch S2. The second switch S2 connects the output and input terminals of the UGA 218, which enable the UGA 218 to buffer the sampled control voltage $V_{ctrl}$. During T7 and T8, the PLL 202 is switched off, however, the control voltage $V_{ctrl}$ required for acquiring the locking frequency $f_{out}$ at output of the PLL 202 is buffered by the UGA 218.

At the onset of T9, the PLL_EN signal transitions from logic low to logic high state and switches on the PLL 202, and the third control signal transitions from logic low to logic high state and enables the third switch S3 for a second predefined period. The enabled third switch S3 connects the output terminal of the UGA 218 and the input terminal of the LPF 212 which causes the UGA 218 to force the stored control voltage $V_{ctrl}$ at the input terminal of the LPF 212. The LPF 212 eliminates the high frequency components from the stored control voltage $V_{ctrl}$ before providing it to the VCO 204. The VCO 204 then generates the clock signal of the locking frequency $f_{out}$ based on the stored control voltage $V_{ctrl}$.

In one embodiment, the stored control voltage $V_{ctrl}$ is provided to the input terminal of the LPF 212 by way of the voltage multiplier 220. The voltage multiplier 220 may multiply/divide the stored control voltage $V_{ctrl}$ by a predefined variable to obtain a predetermined locking frequency $f_{out2}$ (different from the locking frequency $f_{out1}$) at the output of the VCO 204. In an example, the VCO 204 generates a clock signal having a locking frequency $f_{out1}$ of 200 MHz (based on the control voltage $V_{ctrl}$) before the PLL 202 enters in to the STOP mode. However, the VCO 204 may be required to generate a clock signal having another locking frequency $f_{out2}$ of 250 MHz after the PLL 202 wakes up from the STOP mode. In such a case, the voltage multiplier 220 multiplies the stored control voltage $V_{ctrl}$ (stored during the STOP mode) by a factor of 1.25 (250/200=1.25) and enables the PLL 202 to generate a clock signal of another locking frequency $f_{out2}$ of 250 MHz.

The PLL 202 enters in to a second lock state as soon as the clock signal reaches the locking frequency $f_{out}$. The PLL lock signal transition from logic low to logic high state to indicate transition of the PLL 202 in to the second lock state. The second and third control signals transition from logic high to logic low state at the end of the second predefined period and disable the second and third switches S2 and S3, respectively. The time taken by the PLL 202 to enter in to the second lock state is comparatively less than the time taken by the PLL 202 to enter in to the first lock state, because the PLL 202 generates the clock signal having locking frequency $f_{out}$ based on the control voltage $V_{ctrl}$ pumped thereto by the UGA 218.

In various embodiments of the present invention, the control unit 216 does not enable the voltage storage circuit 214 till the PLL 202 acquires the first lock state. The control voltage $V_{ctrl}$ at the input of the VCO 204 in the first lock state is utilized by the voltage storage circuit 214 to achieve a faster subsequent second lock state.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for generating a clock signal, comprising:
   a phase-locked loop (PLL), including:
   a phase-frequency detector (PFD), that generates an error signal based on an input reference signal and a feedback signal;
   a charge pump, connected to the PFD, that generates a charge pump current based on the error signal;
   a low pass filter (LPF) having an input terminal connected to the charge pump for generating a control voltage based on the charge pump current;
   a voltage-controlled oscillator (VCO), connected to an output terminal of the LPF, that generates the clock signal having a frequency proportional to the control voltage; and
   a frequency divider, connected between the VCO and the PFD, that generates the feedback signal by adjusting a frequency of the clock signal; and
   a voltage storage circuit, including:
   a unity-gain amplifier (UGA) having an input terminal and an output terminal;
   a first switch, connected between the input terminal of the UGA and the output terminal of the LPF, for disconnecting the input terminal of the UGA from the output terminal of the LPF when the PLL is in a STOP mode, and connecting the input terminal of the UGA and the output terminal of the LPF, for sampling the control voltage for a first predefined period when the PLL is in a RUN mode;
   a second switch, connected between the output and input terminals of the UGA, for disconnecting the output and input terminals of the UGA when the PLL is in the RUN mode, and connecting the output and input terminals of the UGA at the end of the first predefined period, for storing the sampled control voltage when the PLL is in the STOP mode; and a third switch, connected between the output terminal of the UGA and an input terminal of the LPF, for disconnecting the output terminal of the UGA from the input terminal of the LPF when the PLL is in the STOP mode, and connecting the output terminal of the UGA and the input terminal of the LPF for providing the stored control voltage to the input terminal of the LPF, for a second predefined period when the PLL transitions from the STOP mode to the RUN mode.

2. The system of claim 1, further comprising a control unit for controlling switching of the first, second and third switches.

3. The system of claim 2, wherein the control unit disables the voltage storage circuit and enables the PLL when the PLL enters the RUN mode.

4. The system of claim 2, wherein the control unit disables the PLL when the PLL enters the STOP mode.

5. The system of claim 1, wherein the voltage storage circuit further comprises a voltage multiplier, connected between the output terminal of the UGA and the third switch, for adjusting the stored control voltage based on a predetermined frequency of the clock signal.

6. The system of claim 1, wherein the first, second and third switches each include a complementary metal-oxide semiconductor (CMOS) transmission gate.

7. A system for generating a clock signal, comprising:
a phase-locked loop (PLL), including:
   a phase-frequency detector (PFD), that generates an error signal based on an input reference signal and a feedback signal;
   a charge pump, connected to the PFD, that generates a charge pump current based on the error signal;
   a low pass filter (LPF) having an input terminal connected to the charge pump for generating a control voltage based on the charge pump current;
   a voltage-controlled oscillator (VCO), connected to an output terminal of the LPF, that generates the clock signal having a frequency proportional to the control voltage; and
   a frequency divider, connected between the VCO and the PFD, that generates the feedback signal by adjusting a frequency of the clock signal; and a voltage storage circuit, including:
   a unity-gain amplifier (UGA) having an input terminal and an output terminal;
   a first switch, connected between the input terminal of the UGA and the output terminal of the LPF, for disconnecting the input terminal of the UGA from the output terminal of the LPF when the PLL is in a STOP mode, and connecting the input terminal of the UGA and the output terminal of the LPF, for sampling the control voltage for a first predefined period when the PLL is in a RUN mode;
   a second switch, connected between the output and input terminals of the UGA, for disconnecting the output and input terminals of the UGA when the PLL is in the RUN mode, and connecting the output and input terminals of the UGA at the end of the first predefined period, for storing the sampled control voltage when the PLL is in the STOP mode;
   a voltage multiplier, connected to the output terminal of the UGA, for adjusting the stored control voltage based on a predetermined frequency of the clock signal; and
   a third switch, connected between an output terminal of the voltage multiplier and an input terminal of the LPF, for disconnecting the output terminal of the voltage multiplier from the input terminal of the LPF when the PLL is in the STOP mode, and connecting the output terminal of the voltage multiplier and the input terminal of the LPF for providing the stored control voltage to the input terminal of the LPF, for a second predefined period when the PLL transitions from the STOP mode to the RUN mode.

8. The system of claim 7, further comprising a control unit for controlling switching of the first, second and third switches.

9. The system of claim 8, wherein the control unit disables the voltage storage circuit and enables the PLL when the PLL transitions from the STOP mode to the RUN mode.

10. The system of claim 8, wherein the control unit disables the PLL when the PLL transitions from the STOP mode to the RUN mode.

11. The system of claim 7, wherein the first, second and third switches each include a complementary metal-oxide semiconductor (CMOS) transmission gate.

* * * * *